(12) United States Patent
Tserng et al.

(10) Patent No.: US 7,880,549 B1
(45) Date of Patent: Feb. 1, 2011

(54) TRANSISTOR INCLUDING INTRINSIC HARMONIC TRAP

(75) Inventors: Hua-Quen Tserng, Dallas, TX (US); David Michael Fanning, Garland, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 163 days.

(21) Appl. No.: 12/242,495

(22) Filed: Sep. 30, 2008

(51) Int. Cl.
*H03F 3/04* (2006.01)
(52) U.S. Cl. ...................... 330/303; 330/307
(58) Field of Classification Search ............. 330/303, 330/307, 277
See application file for complete search history.

(56) References Cited

U.S. PATENT DOCUMENTS

| | | | | |
|---|---|---|---|---|
| 4,667,164 A | * | 5/1987 | Doluca | 330/253 |
| 5,027,082 A | * | 6/1991 | Wisherd et al. | 330/277 |
| 6,297,700 B1 | * | 10/2001 | Sevic et al. | 330/277 |
| 2009/0189146 A1 | * | 7/2009 | Burke et al. | 257/24 |

OTHER PUBLICATIONS

Cripps, Steve, RF Power Amplifiers for Wireless Communications; Book, p. 107, Fig. 4.25.

* cited by examiner

*Primary Examiner*—Henry K Choe
(74) *Attorney, Agent, or Firm*—Schwabe Williamson & Wyatt

(57) ABSTRACT

Embodiments include but are not limited to apparatuses and systems including a circuit comprising a unit cell including an input and an output, and a harmonic trap, intrinsic to the unit cell, implemented on one of the input and the output. Other embodiments may be described and claimed.

18 Claims, 6 Drawing Sheets

TRANSISTOR INCLUDING INTRINSIC HARMONIC TRAP

TECHNICAL FIELD

Embodiments of the present invention relate generally to microelectronic devices and more particularly to transistors including intrinsic harmonic traps and circuits incorporating the same.

BACKGROUND

Power amplifiers are generally used for high-output-power applications. High output power, however, is typically at odds with other design factors such as linearity and power-efficiency. To accomplish these goals simultaneously, power amplifiers usually must have optimum harmonic termination impedance at the input and the output. External circuit techniques are typically employed to provide such optimum terminations. These circuits, however, generally are complex and area-consumptive, and sometimes have limited bandwidth.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

The phrase "formed on," along with its derivatives, may be used herein. "Formed on" in the context of a layer being "formed on" another layer may mean that a layer is formed above, but not necessarily in direct physical or electrical contact with, another layer (e.g., there may be one or more other layers interposing the layers). In some embodiments, however, "formed on" may mean that a layer is in direct physical contact with at least a portion of a surface of another layer.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element. In addition, although embodiments of the present invention may be shown and described as including a particular number of components or elements, embodiments of the invention are not limited to any particular number of components or elements.

Figure 1:
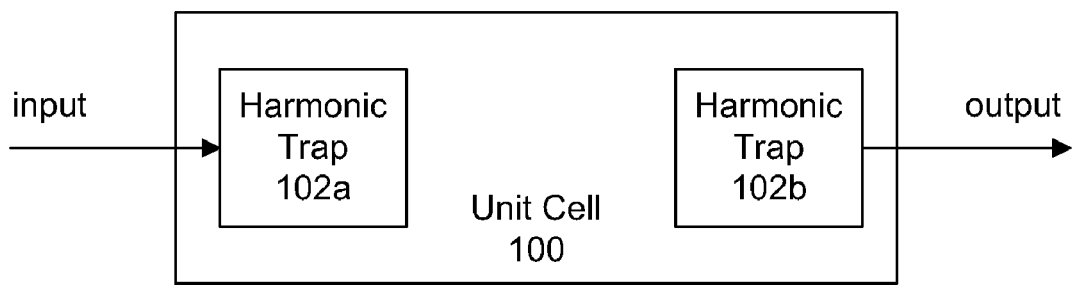
FIG. 1 illustrates a unit cell including intrinsic harmonic traps in accordance with various embodiments.

Turning now to FIG. 1, illustrated is a unit cell 100 including an input and an output, and intrinsic harmonic traps 102a, 102b implemented on the input and output, respectively. While the illustrated embodiment depicts the harmonic traps 102a, 102b as being implemented on both the input and the output, other embodiments may include a harmonic trap being implemented on only one of the input and output.

The harmonic traps 102a, 102b are intrinsic to the unit cell 100. By implementing the harmonic traps 102a, 102b intrinsically, provision of tuning circuitry techniques external to the unit cell 100 may be minimized or avoided altogether. Not only may this result in an area-efficient device but may also minimize the complexity of the manufacturing process.

The intrinsic harmonic traps 102a, 102b may also be configured to provide low impedance terminations for harmonics generated during operation of the unit cell 100. Although the specific configuration of the intrinsic harmonic traps 102a, 102b may depend on the mode of operation of the unit cell 100, in some embodiments the intrinsic harmonic traps 102a, 102b may be configured to provide terminations for second (or higher) harmonics. Moreover, although embodiments of the present invention may be suitable for a vast range of devices, microwave power amplifiers may be particularly enhanced by intrinsic harmonic traps 102a, 102b as such devices typically demand optimum harmonic termination impedance for harmonics higher than the second order for high power-added efficiency and linearity.

Figure 2:
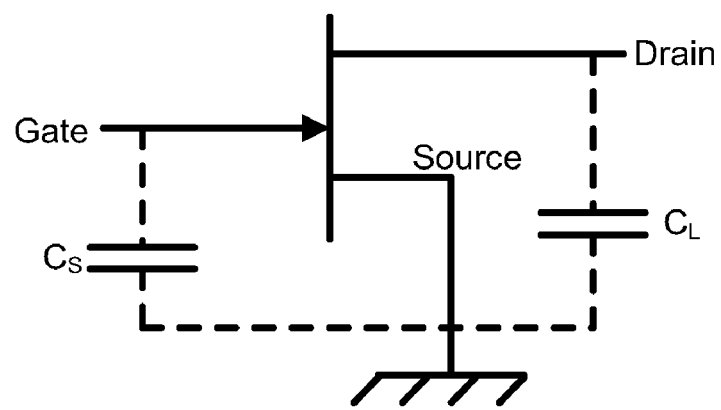
FIG. 2 is a circuit diagram of the unit cell of FIG. 1.

The intrinsic harmonic traps 102a, 102b may be in the form of intrinsic parasitic capacitance. The capacitance may be realized between the gate and source (i.e., at the input) and/or between the drain and source (i.e., at the output) of a transistor of the unit cell 100. FIG. 2 is another depiction of the unit cell 100. FIG. 2 is a circuit diagram depicting the intrinsic capacitance, by way of hashed lines, at the input, $C_S$, and at the output, $C_L$. Although the illustrated embodiment depicts capacitance at both input and output, in some embodiments capacitance may be present at one or both of the input and the output.

Figure 3:
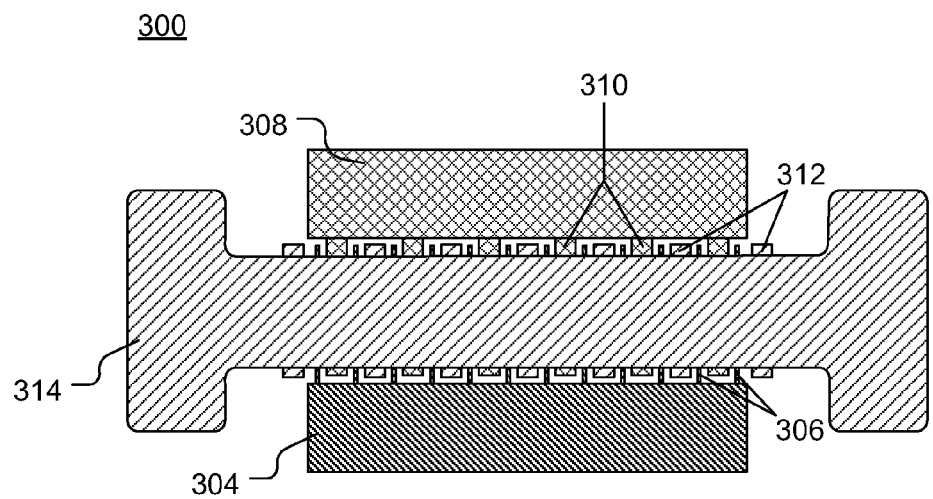
FIG. 3 illustrates a unit cell including intrinsic harmonic traps in accordance with various embodiments.

It is noted that references herein to "unit cell," such as unit cell 100 for example, may comprise one or more unit transistors. In reality, a unit cell may comprise a plurality of unit transistors in parallel for increased power. As illustrated in FIG. 3, for example, a unit cell 300 includes a gate structure 304 including a plurality of gate fingers 306; a drain structure 308 including a plurality of drain fingers 310; and a plurality of source fingers 312 interconnected by a source interconnect bridge 314. In some embodiments, however, a unit cell may include a single transistor having a gate, a source, and a drain.

The unit cell 300 may comprise any one of various transistors. In various embodiments, the unit cell 300 may include transistors suitable for microwave or millimeter wave power amplification applications. The unit cell 300 may comprise one or more field effect transistors (FET) or heterojunction bipolar transistors (HBT). One or more of the FETs may be selected from the group consisting of a high electron mobility transistor (HEMT) (e.g., aluminum gallium nitride/gallium nitride HEMT, etc.), a pseudomorphic (pHEMT) (e.g., gallium arsenide pHEMT, etc.), a laterally diffused metal oxide semiconductor transistor (LDMOS) (e.g., silicon LDMOS, etc.), and a metal epitaxial semiconductor field effect transistor (MESFET) (e.g., gallium arsenide MESFET, silicon carbide MESFET, etc.). Other types of transistors or transistors formed from other types of materials may be similarly suitable. For purposes of illustration and ease of explanation, unit cells are described herein as FETs.

Figure 4:
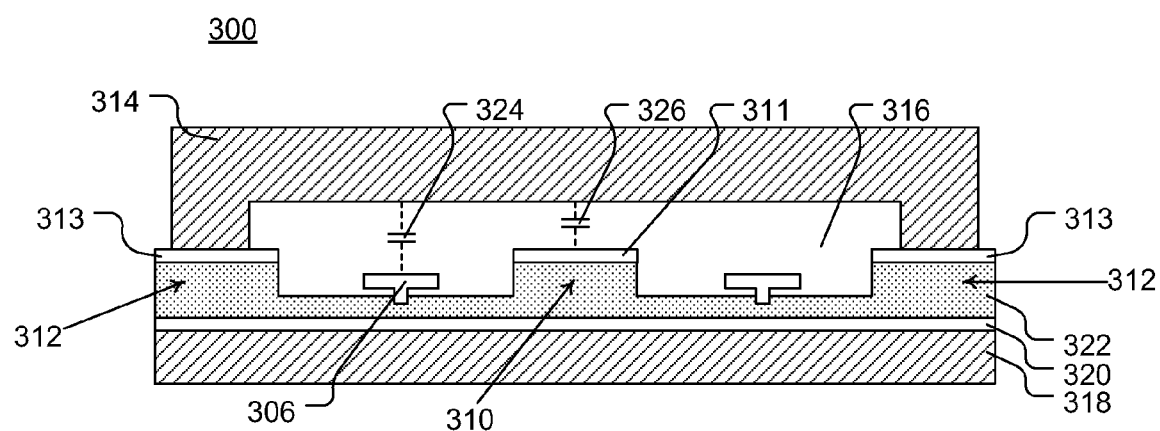
FIG. 4 illustrates a portion of the unit cell of FIG. 3 in accordance with various embodiments.

A cross-sectional view of a portion of the unit cell 300 is illustrated in FIG. 4. The illustrated portion includes two gate fingers 306, two source fingers 312 including source pads 313, and a drain finger 310 including a drain pad 311. The source pads 313 are interconnected by the source interconnect bridge 314.

Although any one of various types of conductive material may be similarly suitable, in some embodiments the source interconnect 314 comprises gold. Moreover, the source interconnect bridge 314 may, in some embodiments, be electrically grounded, thereby electrically grounding the source fingers 312.

The gap 316 under the source interconnect bridge 314 may be filled with one or more layers of suitable dielectric material including, for example, air, oxide (e.g., silicon dioxide), nitride (e.g., silicon nitride), and the like.

The gate fingers 306, source pads 313, and drain pads 311 may comprise any material suitable for the purpose. According to various embodiments, one or more of gate fingers 306, source pads 313, and drain pads 311 may comprise a selected one of gold (Au), nickel-gold (Ni—Au) and titanium-platinum-gold (Ti/Pt/Au). Other metals may be similarly suitable and may depend on the application.

As illustrated, the unit cell 300 includes a substrate 318. For various embodiments, for example, the substrate 318 comprises gallium arsenide (GaAs), gallium nitride (GaN), or another material or combination of materials. In some embodiments, the substrate 318 may comprise silicon carbide, silicon, sapphire, aluminum nitride, or some combination thereof or some combination with another suitable material.

The unit cell 300 further includes a channel layer 320. In embodiments, the channel layer 320 may comprise one or more doped layers. For example, the channel layer 320 may comprise a selected one of an n-p-n channel and an n-channel, depending on the application. In various embodiments, the channel layer 320 may comprise one or more doped or undoped gallium arsenide layers or indium gallium arsenide (InGaAs) layers. Other materials may be similarly suitable including, for example, GaN. In various embodiments, the channel layer 320 may comprise the same material as the substrate 318. In other embodiments, however, the channel layer 320 may comprise a different material than the substrate 318.

The unit cell 300 may further include a barrier layer 322. In various embodiments the barrier layer 322 comprises aluminum gallium arsenide (AlGaAs). Another material or combination of materials may be similarly suitable. For example, the barrier layer 322 may comprise AlGaN. The barrier layer 322 may be doped or undoped.

As illustrated, the gate fingers 306 are depicted as t-gates, including an integral field plate. In other embodiments, however, the gate fingers 306 may instead be configured without a field plate, or with a distinct (i.e., non-integral) field plate.

As discussed herein, a unit cell may include one or more intrinsic harmonic traps. The unit cell 300 illustrated may include one or more of such intrinsic harmonic traps in the form of intrinsic gate-source capacitance 324 between the gate 306 and source 312/314 (i.e., at the input) and/or intrinsic drain-source capacitance 326 between the drain 310 and the source 312/314 (i.e., at the output) of one or more transistors of the unit cell 300.

The harmonic terminations may be tuned by configuring the thickness of and/or material selected for the gap 316. In various embodiments, the thickness of the gap 316 (i.e., between the top of the gate finger 306 and the bottom of the source interconnect bridge 314) may be about from about 4 micrometers to 6 micrometers. The type of material selected for the gap 316 may, in some embodiments, also contribute to the realized capacitance.

The harmonic terminations may be further tuned by controlling the overall gate width. For example, in some embodiments a unit cell may comprise 24 gate fingers, each finger having approximately a 100-micrometer gate width, for a total gate width of 2,400 micrometers.

Figure 5:
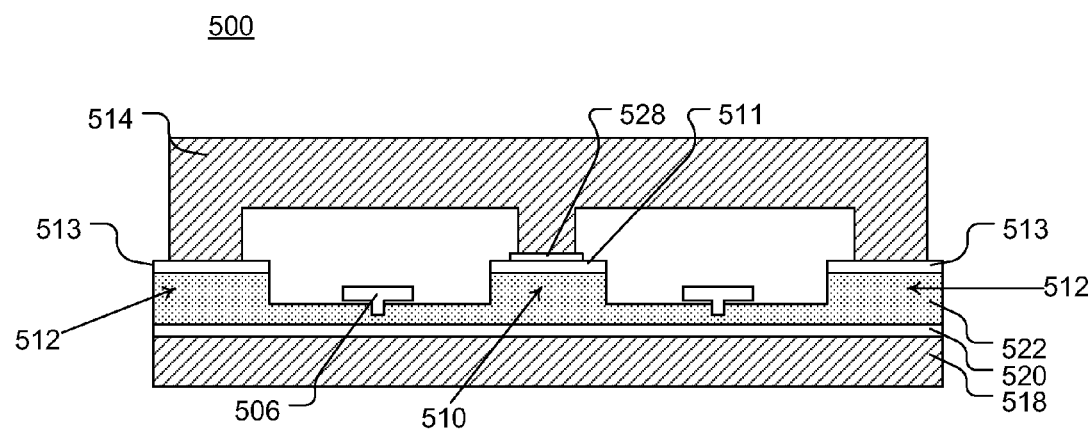
FIG. 5 illustrates another unit cell including intrinsic harmonic traps in accordance with various embodiments.

Turning now to FIG. 5, one or more intrinsic harmonic traps may be implemented using a metal-insulator-metal capacitor directly on top of one or both of the drain and the gate. FIG. 5 illustrates a cross-sectional view of a portion of an embodiment of a unit cell 500 including a substrate 518, a channel layer 520, and a barrier layer 522. Unit cell 500 includes gate fingers 506, source fingers 512 including source pads 513, and a drain finger 510 including a drain pad 511. The source pads 513 are interconnected by the source interconnect bridge 514. The source interconnect bridge 514 is also connected to a dielectric layer 528 on the drain pad 511 of the drain finger 510.

As the source interconnect bridge 514 and the drain pad 511 each comprise a conductive material, the source interconnect bridge 514, dielectric layer 528, and drain pad 511 form a metal-insulator-metal capacitor. Put another way, the source interconnect bridge 514 acts as a first capacitor plate, the drain pad 511 acts as the second capacitor plate, and the dielectric layer 528 acts as the dielectric therebetween.

The dielectric layer 528 may comprise any suitable dielectric material including, for example, oxide (e.g., silicon dioxide), nitride (e.g., silicon nitride), benzocyclobutene, and the like. Other dielectric materials may be similarly suitable.

Figure 6:
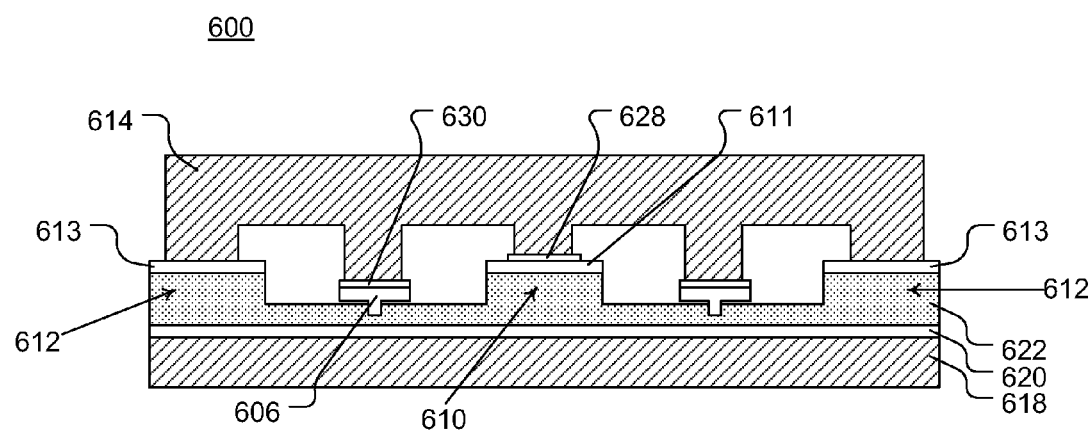
FIG. 6 illustrates another unit cell including intrinsic harmonic traps in accordance with various embodiments.

FIG. 6 illustrates a cross-sectional view of a portion of another embodiment of a unit cell. As illustrated, unit cell 600 includes a substrate 618, a channel layer 620, and a barrier layer 622. The unit cell 600 includes gate fingers 606, source fingers 612 including source pads 613, and a drain finger 610 including a drain pad 611. The source pads 613 are interconnected by the source interconnect bridge 614. The source interconnect bridge 614 is also connected to a dielectric layer 628 on the drain pad 611 of the drain finger 610, and also to a dielectric layer 630 on the gate fingers 606.

The unit cell 600 further includes intrinsic harmonic traps implemented using a metal-insulator-metal capacitor directly on top of both of the drain 610 and the gate 606. As the source interconnect bridge 614 and the drain pad 611 each comprise a conductive material, the source interconnect bridge 614, dielectric layer 628, and drain pad 611 form a metal-insulator-metal capacitor. Similarly, the gate fingers 606 comprise a conductive material, and so the source interconnect bridge 614, dielectric layer 630, and the gate 606 form a metal-insulator-metal capacitor.

As noted herein, unit cells in accordance with various embodiments of the present invention may include gate fingers including an integral field plate (i.e., a t-gate). In some embodiments, unit cells may include gate fingers without field plates, or may include gate fingers including one or more field plates in addition to an integral field plate. Field plate structures may advantageously allow for enhanced device performance. For example, in various embodiments, one or more of high operating voltage, gain, power density, and efficiency may be achieved. Further, minimal knee voltage at high drain biases may also be achieved.

Figure 7:
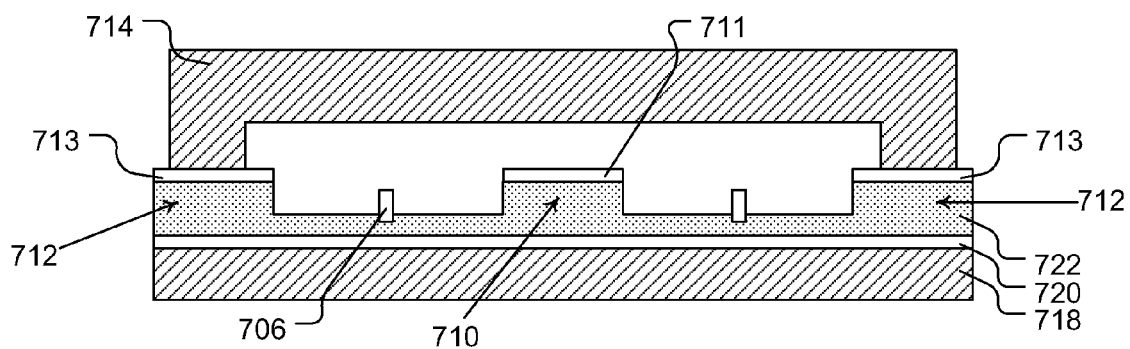
FIG. 7 illustrates another unit cell including intrinsic harmonic traps in accordance with various embodiments.

FIG. 7 illustrates an example unit cell 700 without field plates. As illustrated, the unit cell 700 includes a substrate 718, a channel layer 720, and a barrier layer 722. The unit cell 700 further includes gate fingers 706, a drain finger 710 including a drain pad 711, and source fingers 712 including source pads 713. The source pads 713 are interconnected by a source interconnect bridge 714. Rather than t-gates, gate fingers 706 are formed without an integral field plate.

Figure 8:
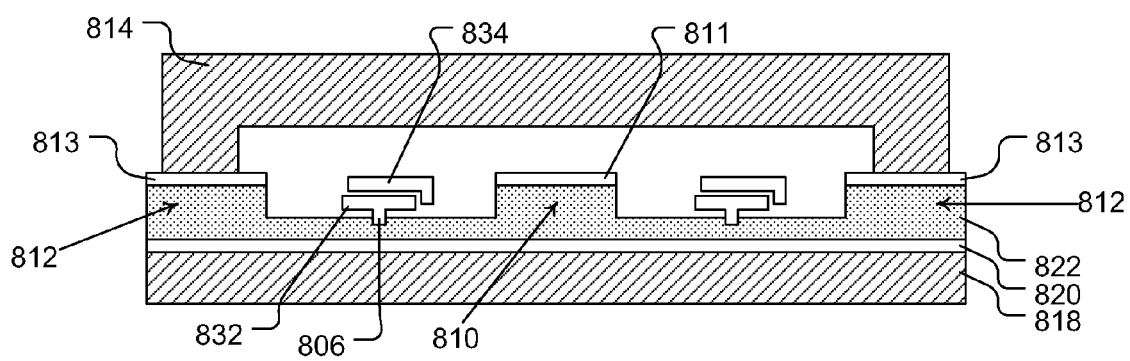
FIG. 8 illustrates another unit cell including intrinsic harmonic traps in accordance with various embodiments.

FIG. 8 illustrates a cross-sectional view of a unit cell 800 including gate fingers 806 including integral first field plates 832 (i.e., t-gates) and further including second field plates 834 formed over the first field plates 832. As illustrated, the unit cell 800 includes a substrate 818, a channel layer 820, and a barrier layer 822. The unit cell 800 further includes source fingers 812 including source pads 813, and a drain finger 810 including a drain pad 811. The source pads 813 are interconnected by the source interconnect bridge 814.

The unit cell 800 may include one or more intrinsic harmonic traps in the form of intrinsic gate-source capacitance between the second field plates 834 and the source 812/814 (i.e., at the input) and/or intrinsic drain-source capacitance between the drain 810 and the source 812/814 (i.e., at the output) of one or more transistors of the unit cell 800.

The field plates 832, 834 may reduce the electric field in the channel layer 820, which may allow the unit cell 800 to operate with an increased operating voltage, gain, power density, and efficiency (i.e., reduced reverse leakage). In some embodiments, the field plates 832, 834 may also provide optimum second harmonic impedance in the form of shunting capacitance, which may result in low second harmonic impendence for increased efficiency performance of the unit cell 800.

In various embodiments, the source fingers 812 may be electrically grounded, and the second field plates 834 may be electrically coupled to the source fingers 812. Accordingly, the second field plates 834 also are electrically grounded by virtue of their being coupled to the source fingers 812. Source grounding the second field plates 834 may provide a shielding effect between the gate fingers 806 and the drain finger 810. Such shielding may advantageously reduce the gate to drain capacitance ($C_{dg}$) and also possibly increase power gains achieved by the unit cell 800.

The gate fingers 806 and the field plates 832, 834 may comprise any material suitable for the purpose. According to various embodiments, one or more of gate fingers 806, first field plates 832, and the second field plates 834 may comprise a selected one of gold (Au), nickel-gold (Ni—Au) and titanium-platinum-gold (Ti/Pt/Au). Other metals may be similarly suitable and may depend on the application.

Figure 9:
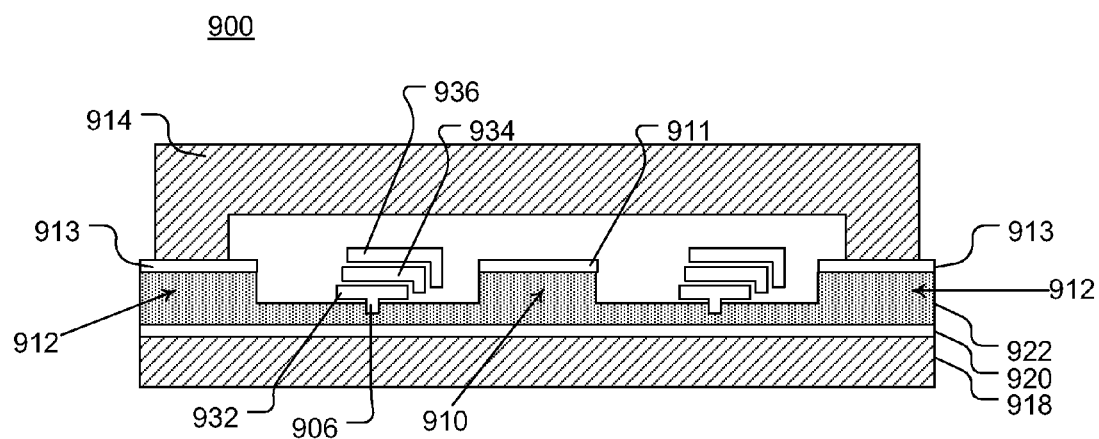
FIG. 9 illustrates another unit cell including intrinsic harmonic traps in accordance with various embodiments.

Additional field plate(s) may further enhance these characteristics to allow a unit cell to operate with a further increased operating voltage, gain, power density, and efficiency. FIG. 9 illustrates an embodiment of a unit cell. Unit cell 900 includes a third field plates 936 formed over second field plates 934, which are formed over gate fingers 906 including integral first field plates 932.

The unit cell 900 includes a substrate 918, a channel layer 920, and a barrier layer 922. The unit cell 900 further includes source fingers 912 including source pads 913, and a drain finger 910 including a drain pad 911. The source pads 913 are interconnected by the source interconnect bridge 914.

The unit cell 900 may include one or more intrinsic harmonic traps in the form of intrinsic gate-source capacitance between the third field plates 936 and the source 912/914 (i.e., at the input) and/or intrinsic drain-source capacitance between the drain 910 and the source 912/914 (i.e., at the output) of one or more transistors of the unit cell 900.

In various embodiments, the source fingers 912 may be electrically grounded, and one or both of the second and third field plates 934, 936 may be electrically coupled to the source fingers 912, and the non-coupled one of the field plates 934, 936 may be floating. As noted herein, source grounding one or both of the second and third field plate 934, 936 may provide a shielding effect between gate fingers 906 and the drain finger 910. Such shielding may advantageously reduce the gate to drain capacitance ($C_{dg}$) and also possibly increase power gains achieved of the unit cell 900.

Figure 10:
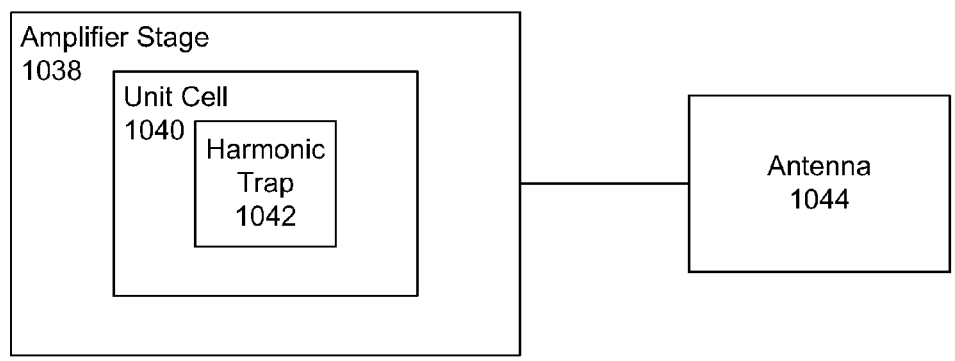
FIG. 10 is a block diagram of a system incorporating a unit cell including intrinsic harmonic traps in accordance with various embodiments.

Embodiments of transistors described herein may be incorporated into various apparatuses and systems. A block diagram of an exemplary system 1000 is illustrated in FIG. 10. As illustrated, the system 1000 may include an amplifier stage 1038 for amplifying a signal. The amplifier stage 1038 may include at least one unit cell 1040 including an input and an output, and at least one harmonic trap 1042, intrinsic to the unit cell 1040, implemented on at least one of the input and the output.

In various embodiments, the amplifier stage 1038 may be configured to amplify signals. The amplifier stage 1038 may be operatively coupled, but not necessarily directly coupled, to an antenna 1044. The antenna 1044 may be configured to facilitate transmission of the amplified signals.

The amplifier stage 1038 may be a power amplifier. In various embodiments, the amplifier stage 1038 may be a power amplifier selected from the group consisting of a class B amplifier, a class C amplifier, class F amplifier, and a class J amplifier.

The system 1000 may be any system used for power amplification at high radio frequency power and frequency. For example, the system 1000 may be suitable for any one or more of terrestrial and satellite communications, radar systems, and possibly in various industrial and medical applications. Radar applications may include military-use radar, air traffic control, navigation, and the like.

In various embodiments, the system 1000 may be a selected one of a radar device, a satellite communication device, a mobile handset, or a cellular telephone base station. The system 1000 may find applicability in other applications in which power amplification for high frequency transmission and/or reception is required.

Figure 11:
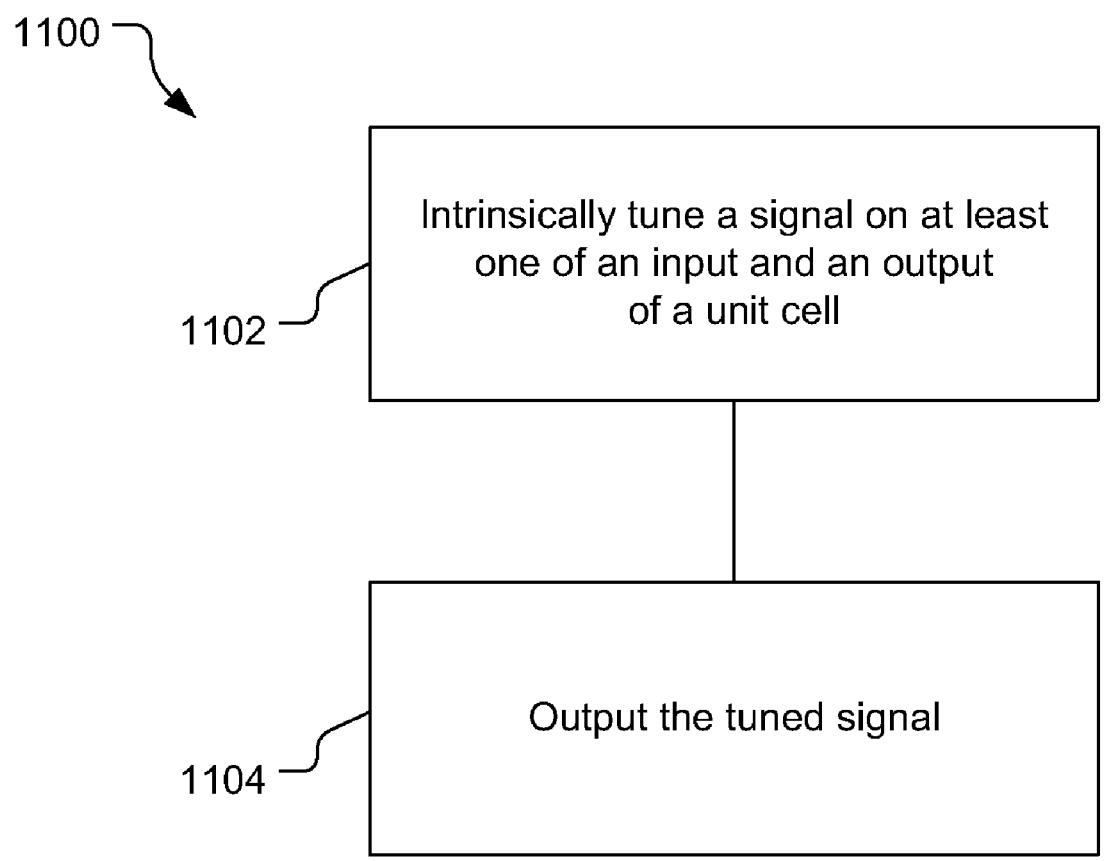
FIG. 11 is a flowchart illustrating operation of an amplification circuit in accordance with various embodiments.

FIG. 11 illustrates a flowchart 1100 depicting a power amplification operation in accordance with various embodiments. At block 1102, a signal may be intrinsically tuned on at least one of an input and an output of a unit cell. At block 1104, the tuned signal may be outputted. The tuning and outputting of the signal may be performed by, for example, the unit cell 100 illustrated in FIG. 1.

In various embodiments, the intrinsically tuning of the signal may comprise implementing a capacitive harmonic termination on at least one of an input and an output of a unit cell. In some of these embodiments, the intrinsically tuning of the signal may capacitively couple a source interconnect bridge of the unit cell with the gates and/or drains of the plurality of transistors of the unit cell.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. A circuit comprising:
   a unit cell including an input and an output, wherein the unit cell comprises a plurality of gate fingers, source fingers, and drain fingers, the input being coupled to the gate fingers, and the output being coupled to the drain fingers; and
   a harmonic trap, intrinsic to the unit cell, implemented on one of the input and the output.

2. The circuit of claim 1, wherein the harmonic trap is implemented on the input.

3. The circuit of claim 1, wherein the harmonic trap is implemented on the output.

4. The circuit of claim 1, further comprising a source interconnect bridge coupled to the source fingers.

5. The circuit of claim 1, wherein the harmonic trap is in the form of gate-source capacitance or drain-source capacitance.

6. The circuit of claim 1, further comprising:
   a source interconnect bridge coupled to the source fingers and capacitively coupled to one or more of the drain fingers and the gate fingers.

7. The circuit of claim 6, further comprising a dielectric material between the source interconnect bridge and the gate fingers.

8. The circuit of claim 7, wherein the dielectric material between a top surface of the gate fingers and the source interconnect bridge has a thickness from 4 to 6 micrometers.

9. The circuit of claim 7, wherein the dielectric material is a selected one of air, silicon nitride, and silicon dioxide.

10. The circuit of claim 6, further comprising a dielectric layer on the drain fingers, and wherein the source interconnect bridge is connected to the dielectric layer to form a metal-insulator-metal capacitor.

11. The circuit of claim 10, wherein the dielectric material is a selected one of silicon nitride, silicon dioxide, and benzocyclobutene.

12. The circuit of claim 6, wherein the source interconnect bridge is configured to capacitively couple to the drain fingers.

13. The circuit of claim 1, wherein the unit cell comprises transistors selected one of a field effect transistors (FETs) and a heterojunction bipolar transistors (HBTs).

14. The circuit of claim 13, wherein the transistors are FETs selected from the group consisting of a pseudomorphic high electron mobility transistor (pHEMTs), laterally diffused metal oxide semiconductor transistor (LDMOSs), and metal epitaxial semiconductor field effect transistor (MESFETs).

15. The circuit of claim 6, further comprising a field plate formed over the gate fingers.

16. A system comprising:
   an amplifier stage for amplifying a signal, the amplifier stage including:
      at least one unit cell, each including an input and an output, wherein the at least one unit cell comprises a plurality of gate fingers, source fingers, and drain fingers, the input being coupled to the gate fingers, and the output being coupled to the drain fingers; and
      at least one harmonic trap, intrinsic to each of the at least one unit cell, implemented on one of the input and the output of the unit cell; and
   an antenna structure operatively coupled to the amplifier stage and configured to facilitate transmission of the amplified signal.

17. The system of claim 16, wherein the amplifier stage is a power amplifier selected from the group consisting of a class B amplifier, a class C amplifier, class F amplifier, and a class J amplifier.

18. The system of claim 16, wherein the system is a selected one of a radar device, a satellite communication device, a mobile handset, and a base station.

* * * * *